United States Patent
Murakami

(10) Patent No.: US 8,159,823 B2
(45) Date of Patent: Apr. 17, 2012

(54) ELECTRIC VEHICLE AND METHOD OF COOLING VEHICULAR DC/DC CONVERTER

(75) Inventor: Tomoatsu Murakami, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 12/521,674

(22) PCT Filed: Jan. 22, 2009

(86) PCT No.: PCT/JP2009/051002
§ 371 (c)(1), (2), (4) Date: Jun. 29, 2009

(87) PCT Pub. No.: WO2009/098948
PCT Pub. Date: Aug. 13, 2009

(65) Prior Publication Data
US 2010/0315780 A1    Dec. 16, 2010

(30) Foreign Application Priority Data
Feb. 6, 2008  (JP) ................. 2008-026445

(51) Int. Cl.
*H05K 7/20* (2006.01)

(52) U.S. Cl. ........ 361/716; 361/689; 361/704; 361/707; 361/717; 257/675; 257/714; 180/65.31; 180/243; 62/259.2

(58) Field of Classification Search .................. None
See application file for complete search history.

(56) References Cited

U.S. PATENT DOCUMENTS
4,420,739 A * 12/1983 Herren ............................ 338/53
(Continued)

FOREIGN PATENT DOCUMENTS

| JP | 2002-93974 | 3/2002 |
|---|---|---|
| JP | 2004-201463 | 7/2004 |
| JP | 2005-332863 | 12/2005 |
| JP | 2005-346948 | 12/2005 |
| JP | 2005-353410 | 12/2005 |
| JP | 2006-286320 | 10/2006 |

OTHER PUBLICATIONS

International Search Report and Written Opinion for Application No. PCT/JP2009/051002, dated Apr. 21, 2009.

*Primary Examiner* — Courtney Smith

(74) *Attorney, Agent, or Firm* — Nelson Mullins Riley & Scarborough LLP; Anthony A. Laurentano

(57) ABSTRACT

The present invention relates to an electric vehicle and a method of cooling a vehicular DC/DC converter. A fuel cell vehicle, as one example of an electric vehicle, includes a DC/DC converter connected between an electricity storage device and a fuel cell for converting a voltage generated by the electricity storage device and applying the converted voltage to a motor, and converting a regenerated voltage produced by the motor in a regenerative mode or a voltage generated by the fuel cell and applying the converted voltage to the electricity storage device, and a cooling apparatus for cooling the DC/DC converter. The cooling apparatus includes a cooling fluid passage therein for a cooling fluid that flows therethrough, the cooling fluid passage including a bend. The cooling apparatus is constructed such that the cooling fluid flowing upstream of the bend cools upper arm devices, while the cooling fluid flowing downstream of the bend cools lower arm devices.

7 Claims, 10 Drawing Sheets

U.S. PATENT DOCUMENTS

| | | |
|---|---|---|
| 7,200,007 B2 | 4/2007 | Yasui et al. |
| 7,438,984 B2 | 10/2008 | Aoyagi et al. |
| 7,656,016 B2 * | 2/2010 | Yoshimatsu et al. ........... 257/686 |
| 7,835,151 B2 * | 11/2010 | Olesen ........................... 361/689 |
| 2005/0270745 A1 * | 12/2005 | Chen et al. .................... 361/707 |
| 2006/0174642 A1 * | 8/2006 | Nagashima et al. ......... 62/259.2 |
| 2007/0248861 A1 * | 10/2007 | Hoshi ............................. 429/26 |

* cited by examiner

US 8,159,823 B2

ELECTRIC VEHICLE AND METHOD OF COOLING VEHICULAR DC/DC CONVERTER

Related Applications

This application is a 35 U.S.C. 371 national stage filing of International Application No. PCT/JP2009/051002, filed Jan. 22, 2009, which claims priority to Japanese Patent Application No. 2008-026445 filed on Feb. 6, 2008 in Japan. The contents of the aforementioned applications are hereby incorporated by reference.

TECHNICAL FIELD

The present invention relates to an electric vehicle having a cooling apparatus for cooling heat-emitting bodies such as switching devices, and a method of cooling a vehicular DC/DC converter.

BACKGROUND ART

There have heretofore been widely used DC/DC converter devices as switching power supplies, having switching devices therein such as MOSFETs, IGBTs, or the like.

For example, there has been proposed a vehicle (hereinafter referred to as an "electric vehicle") having a motor as a propulsive source, and incorporating a DC/DC converter apparatus therein for increasing and reducing a DC voltage, which is connected between an electricity storage device and a motor which is energized by an inverter. On the electric vehicle, when the motor is energized, the voltage across the electricity storage device is increased by the DC/DC converter apparatus and applied to the inverter. When the motor regenerates electric power, the regenerated voltage from the inverter is lowered by the DC/DC converter apparatus and is applied in order to charge the electricity storage device.

There has also been proposed another electric vehicle (hereinafter referred to as a "fuel cell vehicle"), which also uses a motor as a propulsive source. The fuel cell vehicle includes a fuel cell connected directly to the motor which is energized by an inverter. A DC/DC converter apparatus for increasing and reducing a DC voltage is connected between an electricity storage device and a junction between the fuel cell and the motor. The fuel cell is used as a main power supply, and the electricity storage device is used as an auxiliary power supply for assisting the main power supply.

On the fuel cell vehicle, when the motor is energized, the voltage across the fuel cell and the voltage across the electricity storage device, which has been increased by the DC/DC converter apparatus, are added together, and the sum of these voltages is applied to the inverter. When the motor regenerates electric power, the regenerated voltage from the inverter is lowered by the DC/DC converter apparatus and is applied in order to charge the electricity storage device. If the electric power generated by the fuel cell contains an excessive amount of electric power, the electric power is lowered in voltage and then is applied in order to charge the electricity storage device.

The DC/DC converter apparatus comprises a semiconductor module (switching module) including switching devices and diodes. Among these components, the switching devices in particular need to be sufficiently cooled, as the switching devices emit substantial heat when energized. Generally, a cooling apparatus with cooling fluid passages is used for water-cooling the switching module. In view of its usage on vehicles or the like, it is important for the cooling apparatus to have a sufficient cooling capability as well as a small size.

For example, Japanese Laid-Open Patent Publication No. 2002-093974 discloses a cooling apparatus for cooling power semiconductor devices of a power module on a series hybrid vehicle. In order to increase the cooling capability of the cooling apparatus, and to reduce the overall size of the power module, freewheeling diodes of an inverter connected to a generator and switching devices of an inverter of a motor are arrayed in respective phases along straight lines on a cooling plate, and cooling fluid pipes are disposed along the straight lines in the respective phases. In other words, the cooling fluid pipes are disposed along the components that produce intensive heat when the switching devices are energized. The components which are not used when electric power is generated by the generator are not cooled. Further, the number of bends of the cooling fluid passages is reduced, so that the cooling system can be reduced in size.

DISCLOSURE OF THE INVENTION

Fuel cell vehicles carrying fuel cells have characteristics such that when they produce a high level of output power, the voltage across the terminals of the fuel cells tends to be lowered. Even if the vehicle produces the same level of output power when the vehicle is operated in regenerative and propulsive power modes, the voltage difference between a primary end 1S and a secondary end 2S of arm devices, which serve as switching devices of the DC/DC converter, is greater when the vehicle is in the regenerative mode (electric power generating mode), which is affected by a counter electromotive force of the motor, than when the vehicle is in the propulsive power mode. Stated otherwise, the regenerative mode is subject to stricter thermal conditions.

Therefore, if the cooling apparatus disclosed in Japanese Laid-Open Patent Publication No. 2002-093974 were employed, then the switching devices of the DC/DC converter that operate in the regenerative mode are not sufficiently cooled, thus making it difficult to obtain a sufficient amount of regenerated electric power. Therefore, the amount of electric power that can be regenerated on the vehicle is reduced.

The present invention has been made in view of the above problems of the background art. It is an object of the present invention to provide an electric vehicle having a cooling apparatus for a DC/DC converter and a method of cooling a vehicular DC/DC converter, which are capable of increasing the cooling capability for cooling switching devices in a regenerative mode, and of increasing an amount of electric power that can be regenerated on the vehicle.

An electric vehicle according to the present invention comprises an electric motor for rotating wheels, an electric generating device and an electricity storage device for supplying electric power in a parallel fashion to the electric motor, a DC/DC converter connected between the electricity storage device and the electric generating device, for converting a voltage generated by the electricity storage device and applying the converted voltage to the electric motor, and converting a regenerated voltage produced by the electric motor in a regenerative mode or a voltage generated by the electric generating device and applying the converted voltage to the electricity storage device, and a cooling apparatus for cooling the DC/DC converter, the cooling apparatus having a cooling fluid passage therein through which a cooling fluid flows, the cooling fluid passage including a bend, wherein the DC/DC converter has phase arm devices including at least one set of upper arm devices and lower arm devices disposed between the electricity storage device and the electric motor, and wherein the cooling apparatus is constructed such that the cooling fluid flowing upstream of the bend cools the upper arm devices and the cooling fluid flowing downstream of the bend cools the lower arm devices. The electric generating device may comprise a fuel cell.

An electric vehicle according to the present invention comprises an electric motor for rotating wheels, an electricity storage device for supplying electric power to the electric motor, a DC/DC converter connected between the electricity storage device and the electric motor, for converting a voltage generated by the electricity storage device and applying the converted voltage to the electric motor, and converting a regenerated voltage produced by the electric motor in a regenerative mode and applying the converted voltage to the electricity storage device, and a cooling apparatus for cooling the DC/DC converter, the cooling apparatus having a cooling fluid passage therein through which a cooling fluid flows, the cooling fluid passage including a bend, wherein the DC/DC converter has phase arm devices including at least one set of upper arm devices and lower arm devices disposed between the electricity storage device and the electric motor, and wherein the cooling apparatus is constructed such that the cooling fluid flowing upstream of the bend cools the upper arm devices and the cooling fluid flowing downstream of the bend cools the lower arm devices.

A method of cooling a vehicular DC/DC converter according to the present invention comprises the steps of providing a bend in a cooling fluid passage through which a cooling fluid flows to cool a DC/DC converter, which is connected between an electric motor for rotating wheels and an electricity storage device for supplying electric power to the electric motor, and which has phase arm devices including at least one set of upper arm devices and lower arm devices, cooling the upper arm devices with the cooling fluid flowing upstream of the bend, and cooling the lower arm devices with the cooling fluid flowing downstream of the bend.

According to the present invention, the cooling fluid flowing upstream of the bend cools the upper arm devices, whereas the cooling fluid flowing downstream of the bend cools the lower arm devices, so that the cooling capability of the DC/DC converter in the regenerative mode can be effectively increased in order to increase the amount of electric power that can be regenerated by the electric vehicle.

If the DC/DC converter includes a reactor therein for discharging and storing energy when the voltage between the electricity storage device and the electric motor is converted, and the cooling apparatus is constructed such that the cooling fluid flowing in the bend cools the reactor, then there is no need to provide a separate cooling apparatus or the like for cooling the reactor, and the electric vehicle can be simplified in structure.

BEST MODE FOR CARRYING OUT THE INVENTION

A method of cooling a vehicular DC/DC converter according to a preferred embodiment of the present invention will be described, with reference to the accompanying drawings, in relation to an electric vehicle to which the method is applied.

First, the basic structure of a fuel cell vehicle 20, as an electric vehicle according to the present embodiment, will be described below.

Figure 1:
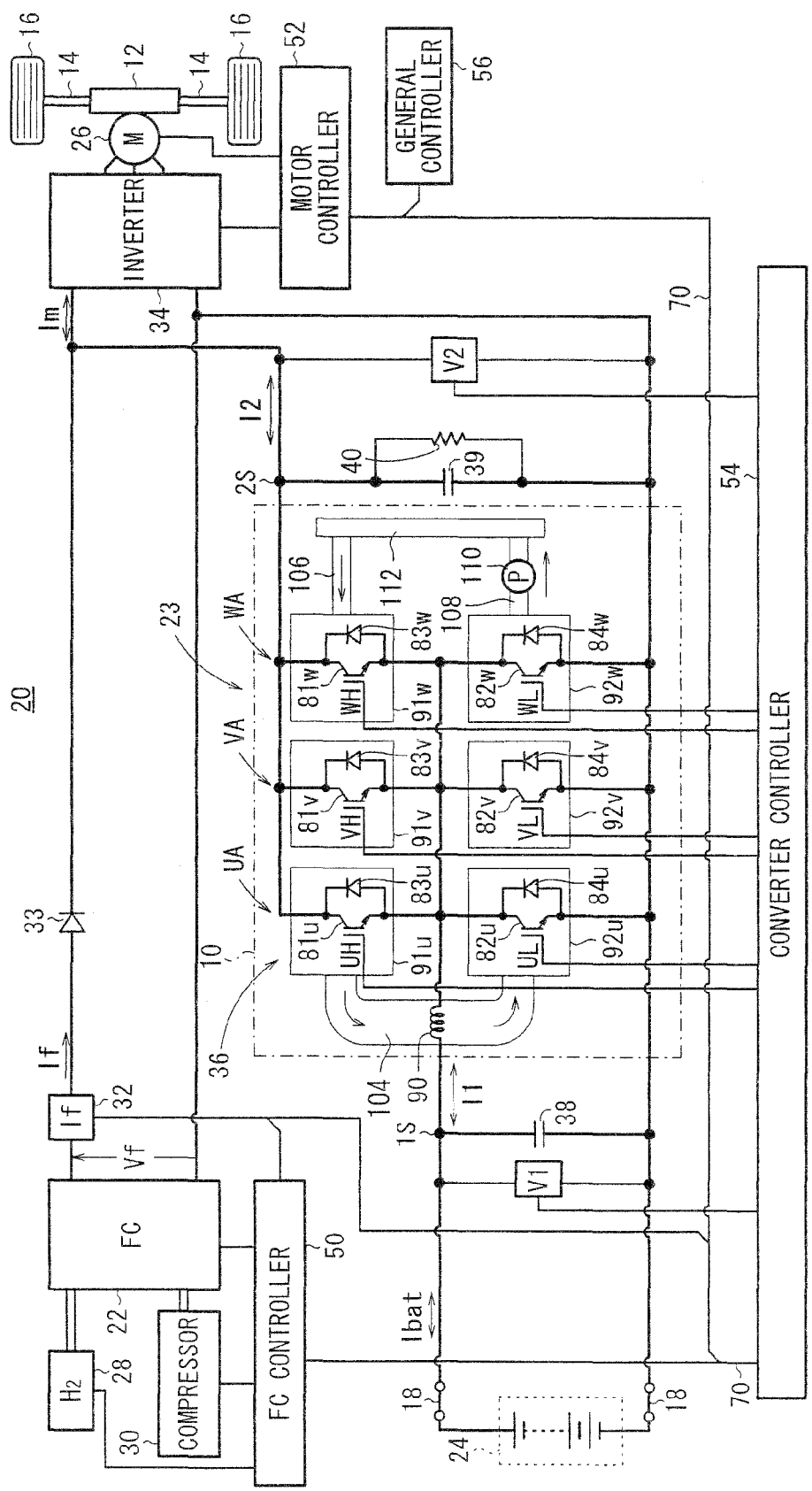
FIG. 1 is a circuit diagram of a fuel cell vehicle according to an embodiment of the present invention.

As shown in FIG. 1, the fuel cell vehicle 20 basically comprises a hybrid power supply device including a fuel cell 22 and an electricity storage device (referred to as a "battery") 24 serving as an energy storage, a propulsive motor (electric motor) 26 supplied with a current (electric power) from the hybrid power supply device through an inverter 34, and a DC/DC converter apparatus 23. The DC/DC converter apparatus 23 converts voltages between a primary end 1S connected to the battery 24 and a secondary end 2S connected to the fuel cell 22 and the motor 26 (the inverter 34). The battery 24 is connected to the primary end 1S of the DC/DC converter apparatus 23 through power lines 18.

Rotation of the motor 26 is transmitted through shafts 14 to wheels 16 for rotating the wheels 16.

The DC/DC converter apparatus 23 comprises a DC/DC converter (vehicular DC/DC converter) 36, and a converter controller 54 for controlling the DC/DC converter 36.

The fuel cell 22 comprises a stacked structure made up of cells, each comprising an anode, a cathode, and a solid polymer electrolyte membrane sandwiched between the anode and cathode. The fuel cell 22 is connected to a hydrogen tank 28 and an air compressor 30 by pipes. The fuel cell 22 generates a current If caused by an electrochemical reaction between a reaction gas (fuel gas) of hydrogen and air (oxygen-containing gas). The generated current If is supplied through a current sensor 32 and a diode (also referred to as a "disconnecting diode") 33 to the inverter 34 and/or the DC/DC converter 36.

The inverter 34 converts the direct current If into an alternating motor current, which is supplied to the motor 26. The inverter 34 also converts an alternating motor current, which is generated by the motor 26 in a regenerative mode, into a direct motor current Im, which is supplied from the secondary end 2S to the primary end 1S through the DC/DC converter 36.

A secondary voltage V2, which may consist of the regenerated voltage in the regenerative mode or a generated voltage Vf, is converted into a low primary voltage V1 by the DC/DC converter 36.

The battery 24, which is connected to the primary end 1S, may comprise a lithium ion secondary battery or a capacitor. In the present embodiment, the battery 24 comprises a lithium ion secondary battery.

The battery 24 supplies the motor current Im to the inverter 34 through the DC/DC converter 36.

Smoothing capacitors 38, 39 are connected respectively across the primary and secondary ends 1S, 2S. A resistor 40 is connected across the smoothing capacitor 39, and across the fuel cell 22.

A system including the fuel cell 22 is controlled by an FC controller 50. Another system, which includes the inverter 34 and the motor 26, is controlled by a motor controller 52 which incorporates an inverter driver therein. Another system, which includes the DC/DC converter 36, is controlled by the converter controller 54 which incorporates a converter driver therein.

The FC controller 50, the motor controller 52, and the converter controller 54 are controlled by a general controller 56, which serves as a higher-level controller for determining a total load Lt on the fuel cell 22, etc. The general controller 56, the FC controller 50, the motor controller 52, and the converter controller 54 are connected to each other via communication lines 70, such as a CAN (Controller Area Network) that serves as an intravehicular LAN, and perform various functions by sharing input and output information from various switches and sensors, and by executing programs stored in the ROMs under the CPUs, based on input and output information from the various switches and sensors.

The DC/DC converter 36 comprises three phase arms connected in parallel to each other between a first power device (battery 24) and a second power device, made up of the fuel cell 22 or the regenerative power supply (the inverter 34 and the motor 26). The three phase arms include a U-phase arm UA ($81u$, $82u$), a V-phase arm VA ($81v$, $82v$), and a W-phase arm WA ($81w$, $82w$), which are made up of upper arm devices 81 ($81u$, $81v$, $81w$) and lower arm devices 82 ($82u$, $82v$, $82w$) comprising switching devices such as IGBTs or the like.

Diodes $83u$, $83v$, $83w$, $84u$, $84v$, $84w$ inverse parallel diodes) are connected inversely across the respective arm devices $81u$, $81v$, $81w$, $82u$, $82v$, $82w$.

A single reactor 90 for discharging and storing energy at a time when the DC/DC converter 36 converts between the primary voltage V1 and the secondary voltage V2 is inserted between the battery 24 and the commonly connected midpoints of the three phase arms (the U-phase arm UA, the V-phase arm VA, and the W-phase arm WA).

The upper arm devices 81 ($81u$-$81w$) are turned on by gate drive signals (drive voltages) UH, VH, WH, which are output from the converter controller 54 when the gate drive signals UH, VH, WH are high in level. The lower arm devices 82 ($82u$, $82v$, $82w$) are turned on by gate drive signals (drive voltages) UL, VL, WL, which are output from the converter controller 54 when the gate drive signals UL, VL, WL are high in level.

Basic operations of the DC/DC converter 36 controlled by the converter controller 54 will be described below.

In a voltage increasing mode, the converter controller 54 turns on the lower arm device $82u$ to store energy in the reactor 90 with a battery current Ibat (primary current I1), and at the same time supplies a secondary current I2 from the capacitor 39 to the inverter 34. Then, when the converter controller 54 turns off the lower arm device $82u$, the diodes $83u$-$83w$ are rendered conductive in order to discharge energy from the reactor 90, thereby storing the energy in the capacitor 39 and supplying the secondary current I2 to the inverter 34. Thereafter, similarly, the converter controller 54 turns on the lower arm device $82v$ and then turns off the lower arm device $82v$, rendering the diodes $83u$-$83w$ conductive. Then, the converter controller 54 turns on the lower arm device $82w$ and then turns off the lower arm device $82v$, rendering the diodes $83u$-$83w$ conductive. Then, the converter controller 54 turns on the lower arm device $82u$, so as to operate the DC/DC converter 36 in a rotation switching process, in accordance with the above sequence.

The upper arm devices $81u$, $81v$, $81w$ and the lower arm devices $82u$, $82v$, $82w$ have respective ON duty ratios, which are determined from the general controller 56 in order to keep the output voltage V2 at a command voltage.

In a voltage reducing mode, for supplying the secondary current I2 from the secondary end 2S of the DC/DC converter 36 to the battery 24 at the primary end 1S, the converter controller 54 turns on the upper arm device $81u$ in order to store energy in the reactor 90 with the secondary current I2 output from the capacitor 39, and at the same time to supply the primary current I1 from the capacitor 38. Then, when the converter controller 54 turns off the upper arm device $81u$, the diodes $84u$-$84w$ are rendered conductive as flywheel diodes, so as to discharge energy from the reactor 90, thereby storing the energy in the capacitor 38 and supplying the primary current I1 to the inverter 34. Thereafter, similarly, the converter controller 54 operates the DC/DC converter 36 in a rotation switching process, by turning on the upper arm device $81v$, turning off the upper arm device $81v$, rendering the diodes $84u$-$84w$ conductive, turning on the upper arm device $81w$, turning off the upper arm device $81w$, rendering the diodes $84u$-$84w$ conductive, and turning on the upper arm device $81u$, and so on, in the aforementioned order.

Basic operations of the DC/DC converter 36 as controlled by the converter controller 54 have been described above.

Figure 2A:
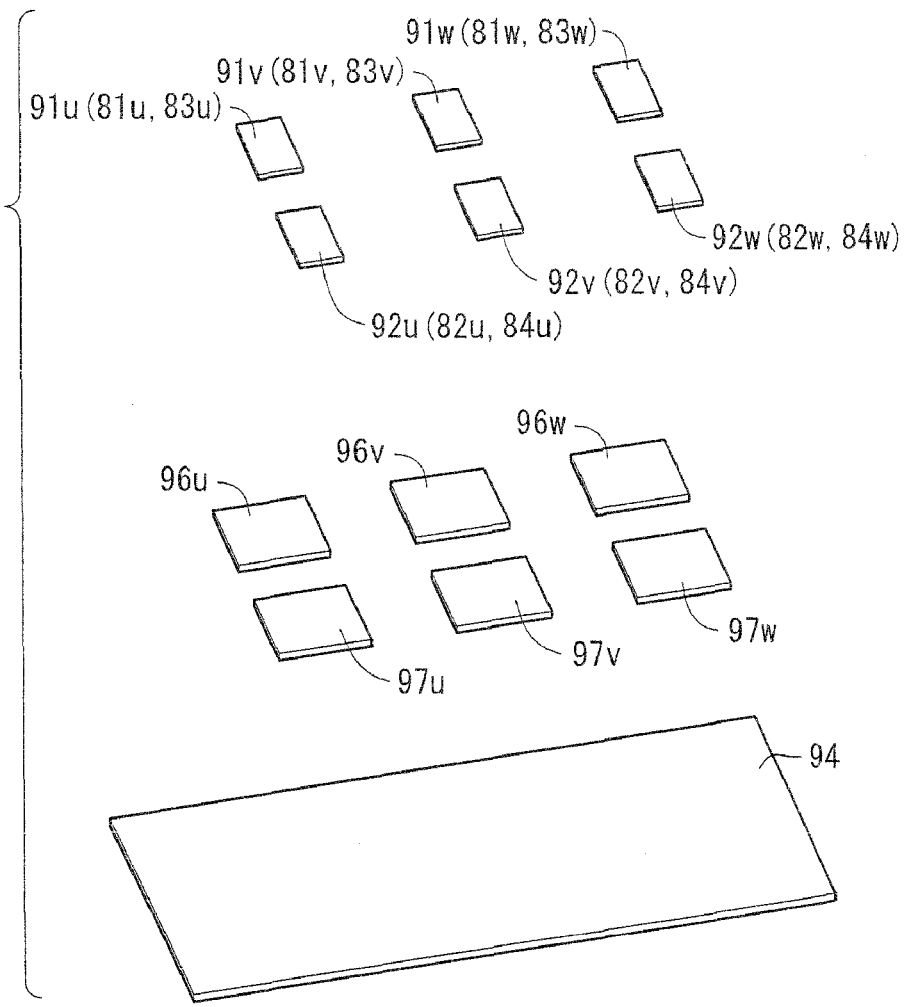
FIG. 2A is a schematic exploded perspective view of a switching module of a DC/DC converter.
Figure 2B:
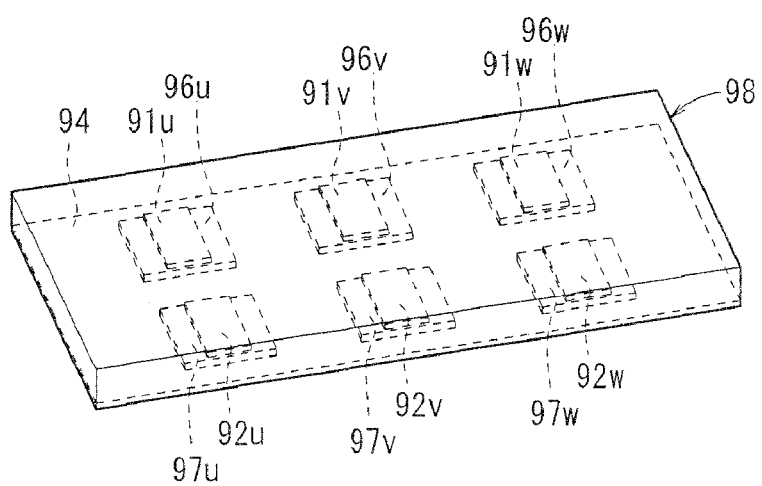
FIG. 2B is a schematic perspective view of the switching module shown in FIG. 2A.

As shown in FIGS. 1, 2A, and 2B, the arm devices $81u$-$81w$, $82u$-$82w$ and the diodes $83u$-$83w$, $84u$-$84w$ corresponding thereto are integrated together as sets (e.g., a set is made up of the upper arm device $81u$ and the diode $83u$), respectively, on upper chips 91 {$91u$, $91v$, $91w$ ($91u$-$91w$)} and lower chips 92 {$92u$, $92v$, $92w$ ($92u$-$92w$)}. The upper chips $91u$-$91w$ and the lower chips $92u$-$92w$ are arrayed on and secured to a single (common) heat radiating plate (heat spreader) 94 made of metal (copper, aluminum, or the like), with respective insulating boards 96 {$96u$, $96v$, $96w$ ($96u$-$96w$)} and insulating boards 97 {$97u$, $97v$, $97w$ ($97u$-$97w$)} sandwiched therebetween. The upper chips $91u$-$91w$, the lower chips $92u$-$92w$, the heat radiating plate 94, the insulating boards $96u$-$96w$, and the insulating boards $97u$-$97w$, are molded together integrally into a switching module 98 (see FIGS. 2B and 7).

The switching module 98 is constructed as a so-called 6-in-1 module, with the arm devices $81u$-$81w$, $82u$-$82w$ having respective gate terminals connected to the converter controller 54.

A cooling apparatus 10 for cooling the DC/DC converter 36 will be described below.

Figure 3:
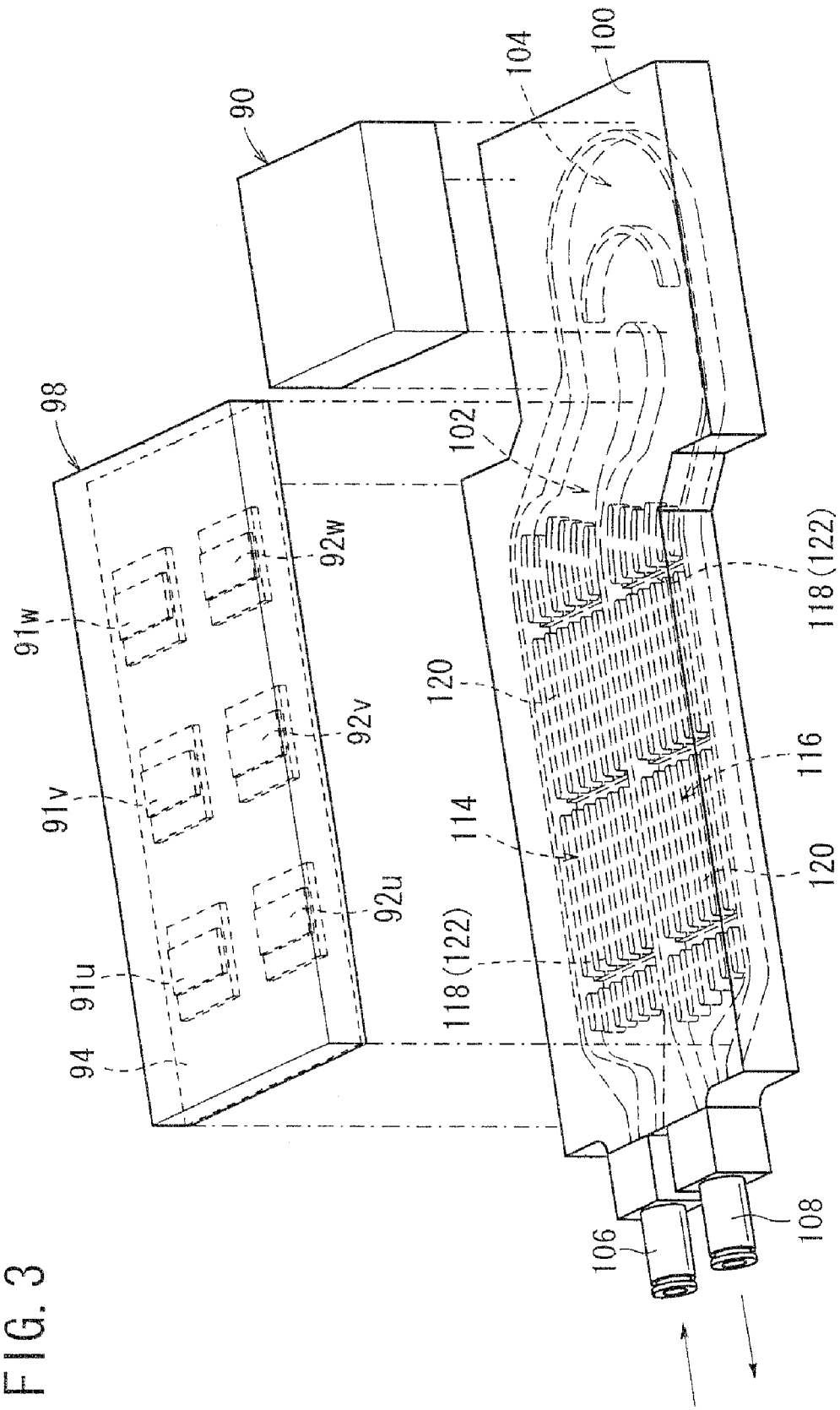
FIG. 3 is a schematic perspective view showing the structure of a cooling apparatus.

As shown in FIG. 3, the cooling apparatus 10 comprises a casing 100 in the form of a flat box, and a cooling fluid passage 102 housed in the casing 100 for allowing a cooling fluid (e.g., water or a coolant) to flow therethrough. The cooling apparatus 10 provides high thermal conductivity between the surface of the casing 100 and the cooling fluid passage 102 (cooling fluid). The cooling fluid passage 102 includes a U-shaped bend 104 in an intermediate portion thereof, and an inlet port 106 and an outlet port 108 that are positioned side by side on a side surface of the casing 100. The cooling fluid circulates in sequence through the cooling fluid passage 102 via the inlet port 106 and the outlet port 108 so as to cool the switching module 98, which is held in close contact with the casing 100 with the heat radiating plate 94 interposed therebetween.

As shown in FIG. 1, a circulation pump 110 and a radiator 112 are connected to the cooling fluid passage 102 through the inlet port 106 and the outlet port 108. When the circulation pump 110 is actuated, the cooling fluid circulates through the cooling fluid passage 102. The cooling fluid, as it flows out of the outlet port 108, is cooled by radiating heat in the radiator 112, after which the cooling fluid circulates from the inlet port 106 back into the cooling fluid passage 102 in order to cool the switching module 98.

Figure 4:
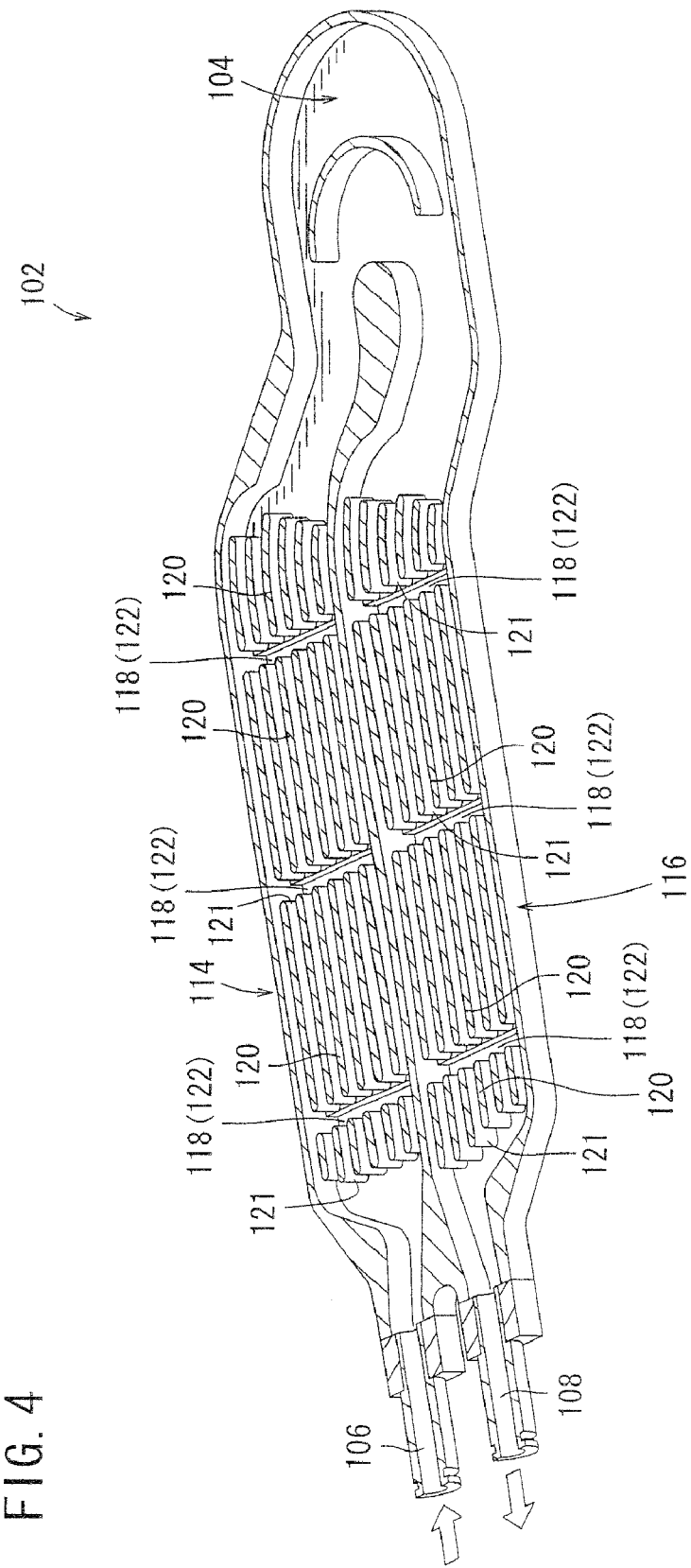
FIG. 4 is a schematic sectional perspective view of a cooling fluid passage of the cooling apparatus, taken along a direction in which a cooling fluid flows through the cooling fluid passage.
Figure 5:
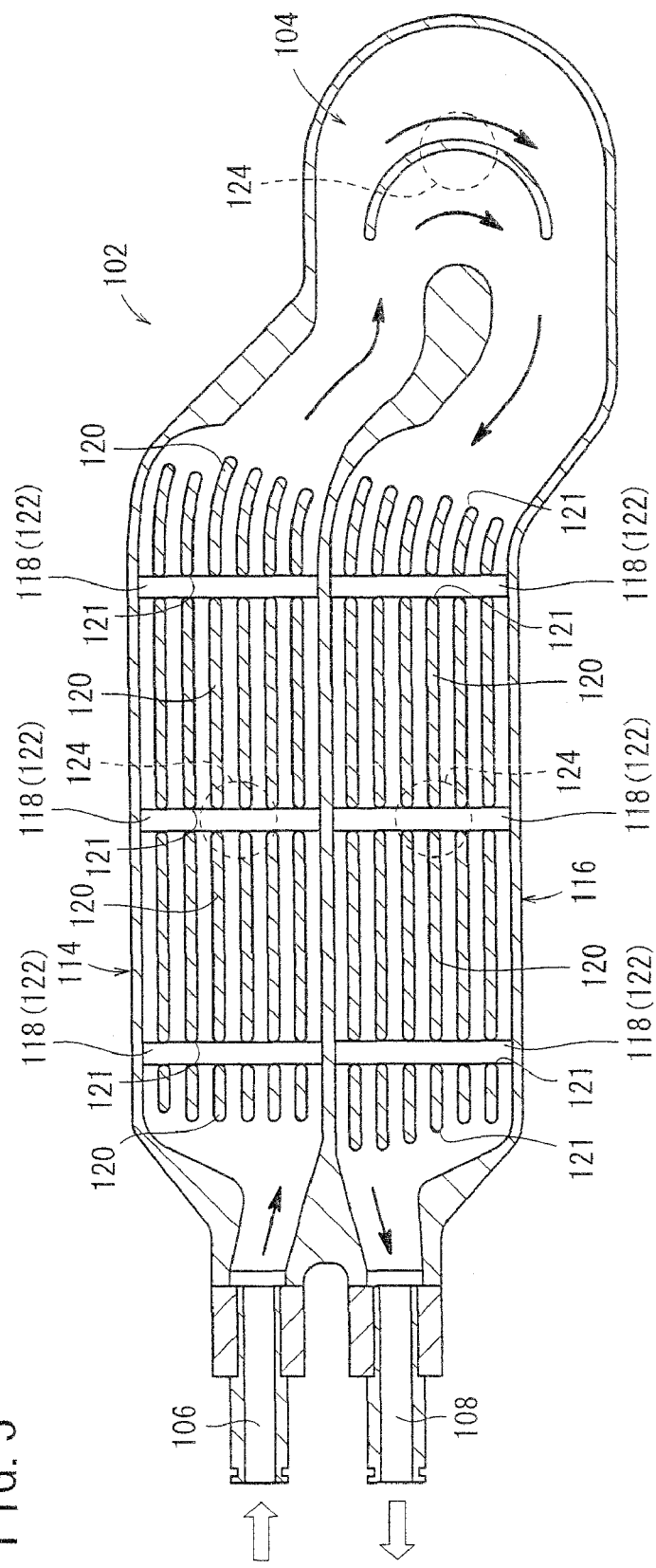
FIG. 5 is a schematic sectional plan view of a cooling fluid passage of the cooling apparatus, taken along a direction in which the cooling fluid flows through the cooling fluid passage.

As shown in FIGS. 4 and 5, the cooling fluid passage 102 comprises a first straight portion (upper straight portion) 114 through which the cooling fluid that flows in from the inlet port 106 immediately after it is cooled by the radiator 112 initially flows, the bend 104 for reversing the flow direction of the cooling fluid that has passed through the first straight portion 114, and a second straight portion (lower straight portion) 116 that extends parallel to the first straight portion 114 through which the cooling fluid that has passed through the bend 104 flows. The cooling fluid, after having passed through the second straight portion 116, is delivered through the outlet port 108 again to the radiator 112. Since the first straight portion 114 and the second straight portion 116 extend parallel to each other with the bend 104 interposed therebetween, the structure of the cooling fluid passage 102 is greatly reduced in size overall. Since the inlet port 106 and the outlet port 108 are placeable side by side, the degree of freedom at which the cooling apparatus 10 can be installed in the fuel cell vehicle 20 is increased.

Each of the straight portions 114, 116 houses a plurality (six in the present embodiment) of cooling fins (heat radiating fins) 120 extending in the flow direction of the cooling fluid. The cooling fins 120 are divided into four groups along the flow direction (longitudinal direction) by three recesses (gaps) 118. The cooling fins 120 comprise thin plates of copper, aluminum, or the like, and are capable of transmitting heat from the switching module 98 highly efficiently to the cooling fluid. Each of the cooling fins 120 includes curved round portions (round shapes) 121 on ends thereof in the flow direction.

The recesses 118 serve to divide the cooling fins 120 at given positions along the longitudinal direction thereof, thereby providing spaces which are free of the cooling fins 120, i.e., chambers 122, within the straight portions 114, 116. The recesses 118 are provided depending on the intervals at which the chips 91u-91w, 92u-92w are disposed (see FIG. 6). In other words, the straight portions 114, 116 have three chambers 122 disposed in respective positions thereof corresponding to the chips 91u-91w, 92u-92w.

Figure 6:
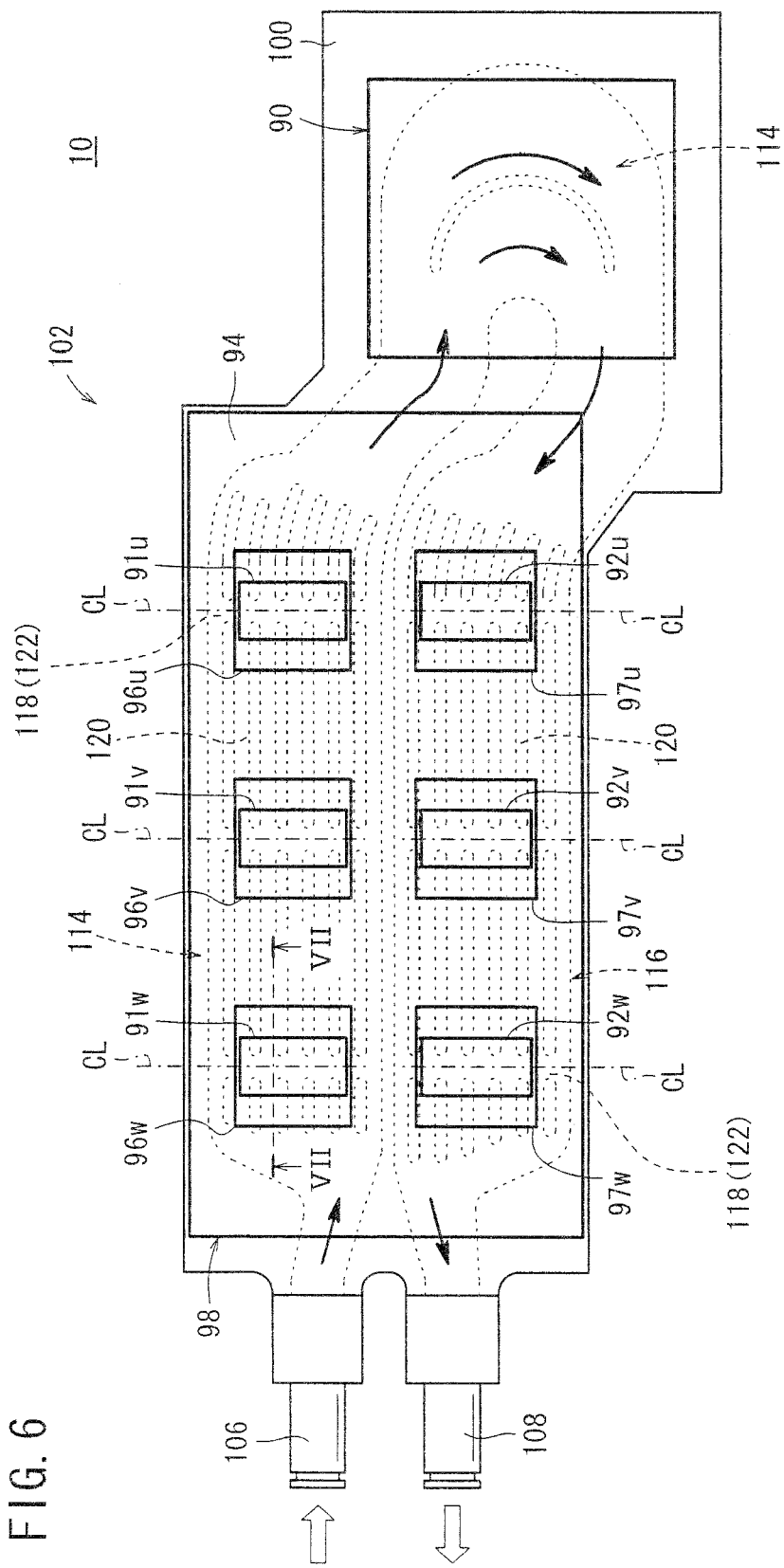
FIG. 6 is a schematic plan view of the cooling apparatus.
Figure 7:
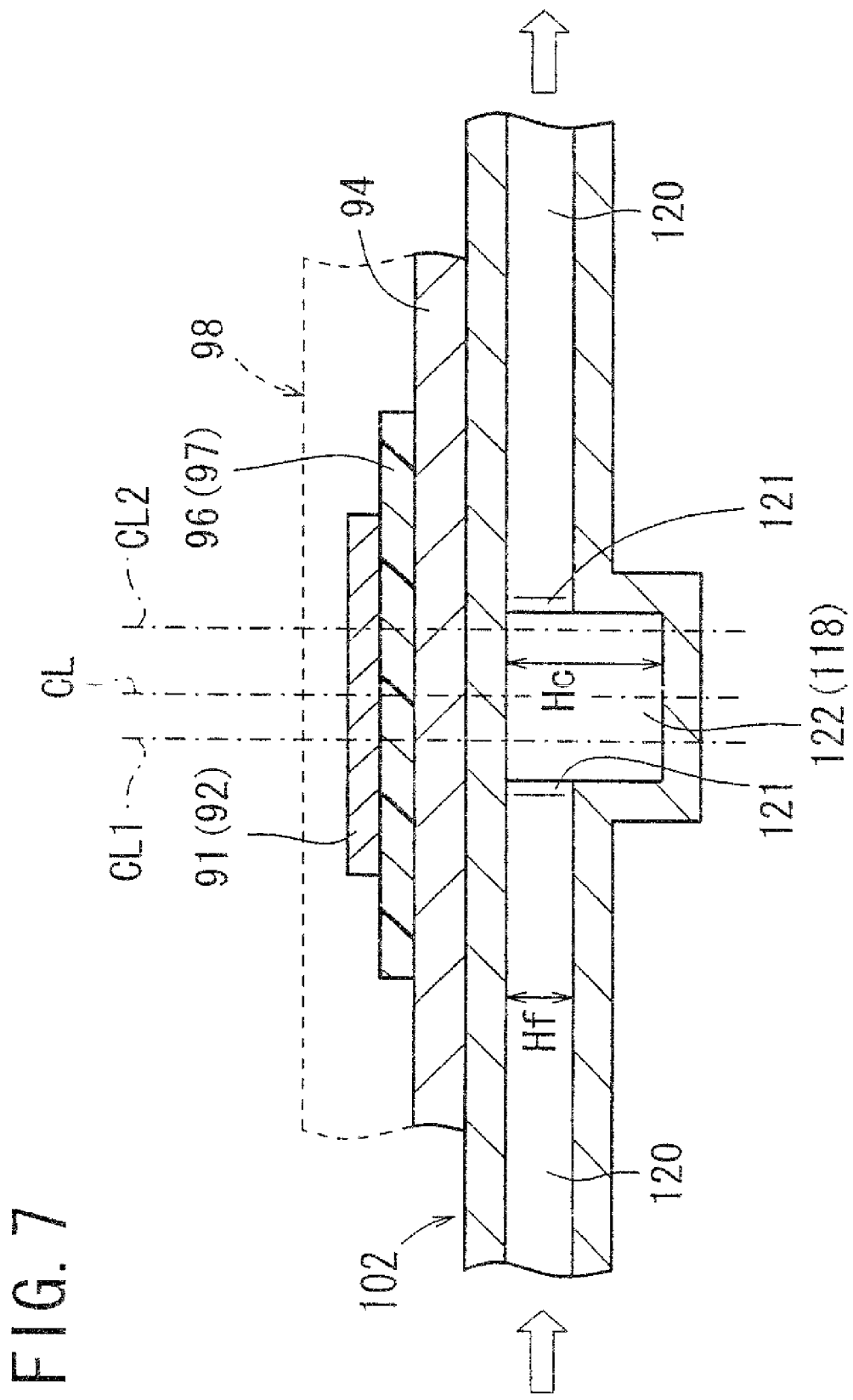
FIG. 7 is a schematic cross-sectional view taken along line VII-VII of FIG. 6.

As can be seen from FIGS. 6 and 7, the chambers 122 are disposed in respective positions, corresponding to central lines CL passing through centers of the chips 91u-91w, 92u-92w which serve as heating bodies, with respect to the flow direction of the cooling fluid. The chambers 122 have a height Hc greater than the height Hf of the cooling fins 120 (Hc>Hf), and hence, the chambers 122 have as large a volume as possible. For increasing the volume of the chambers 122, it also is possible to increase the transverse dimension (i.e., in a direction perpendicular to the flow direction of the cooling fluid) of portions of the chambers 122.

Reference numerals 124 in FIG. 5 represent sand removal holes, as indicated by the broken lines, which serve to remove sand when the cooling fluid passage 102 is cast into a given shape. If the sand removal holes 124 are disposed at positions corresponding to the chambers 122, then the volume of the chambers 122 can further be increased in size.

With the cooling apparatus 10, the upper chips 91u-91w of the switching module 98 used in the regenerative mode are disposed over the first straight portion 114 upstream of the bend 104, whereas the lower chips 92u-92w in the propulsive power mode are disposed over the second straight portion 116 downstream of the bend 104. Moreover, the reactor 90 can be disposed over the bend 104. There is no need to provide a separate cooling apparatus or the like for cooling the reactor 90, which is disposed over the bend 104. Since the reactor 90 can be cooled simultaneously (see FIGS. 3 and 6), the space of the bend 104 is utilized more effectively.

Operations and advantages of the fuel cell vehicle 20 according to the present embodiment, basically constructed as described above, and a method of cooling a DC/DC converter with the cooling apparatus 10, shall be described below.

Figure 8:
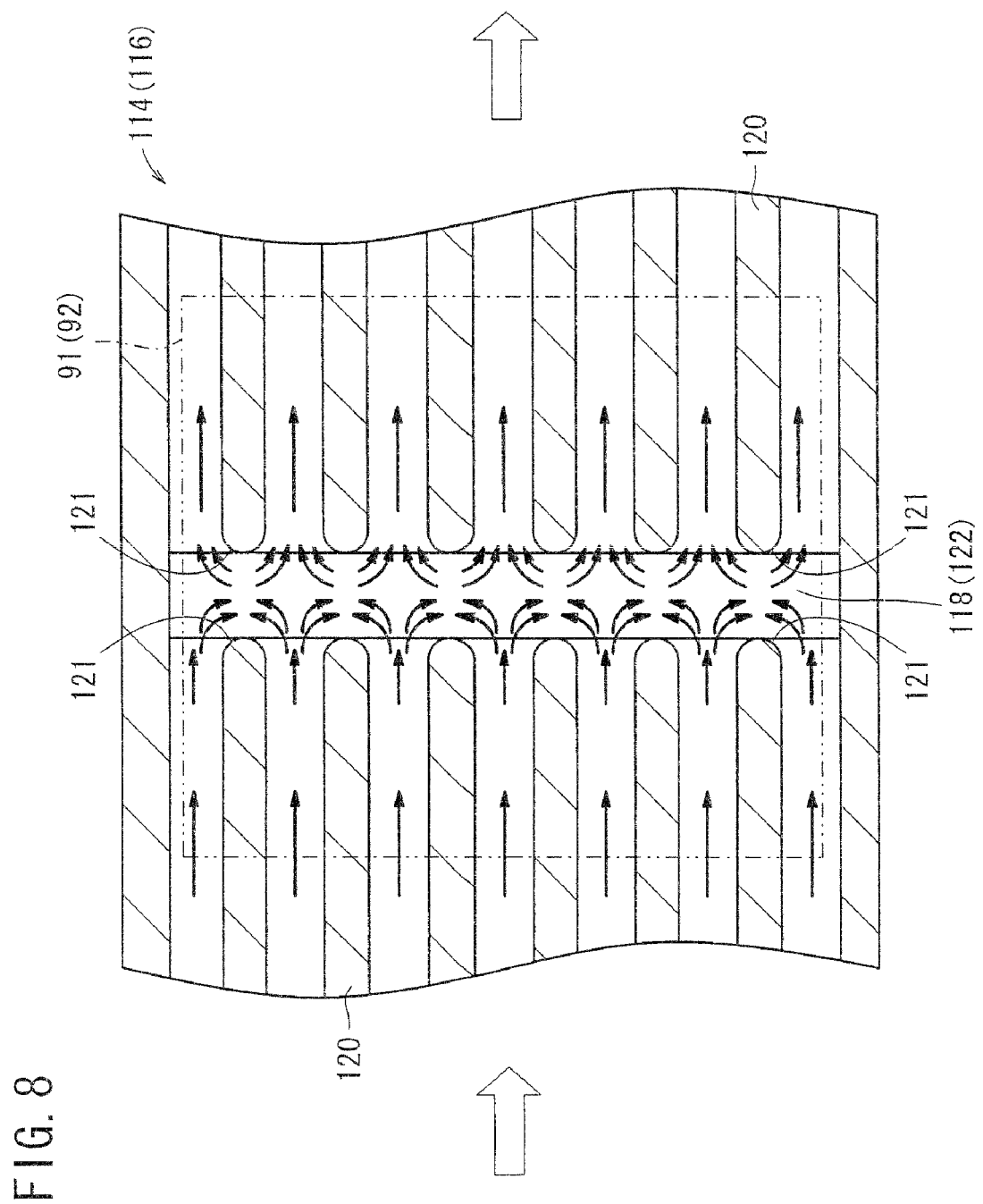
FIG. 8 is a schematic view showing flows of the cooling fluid near a chamber in the cooling fluid passage.

As described above, the cooling fins 120 are disposed within the straight portions 114, 116, which correspond respectively to the chips 91u-91w, 92u-92w of the switching module 98, and the recesses 118 are provided within the cooling fins 120, thereby providing the chambers 122. Therefore, the introduced cooling fluid flows from narrow passageways between the cooling fins 120 into the chambers 122, which are wider spaces, thereby disturbing the flow of the cooling fluid inside the chambers 122 (see FIG. 8). Stated otherwise, the cooling fluid that flows inside the straight portions 114, 116 is in a laminar flow state, or flows in a rectified manner approximating a laminar flow, while the cooling fluid develops a turbulent flow inside the chambers 122. In the chambers 122, therefore, thermal conductivity between the cooling fluid and the switching module 98 is greatly increased, thereby increasing the cooling capability of the cooling apparatus 10. That is, the cooling apparatus 10 can be constructed with a smaller size while also providing a desired cooling capability.

Since the height Hc of the chambers 122 is greater than the height Hf of the cooling fins 120, the volume of the chambers 122 can be made as large as possible in comparison to the cooling fin portions. Thus, the cooling capability is further increased, while the size of the cooling fluid passage 102 is held to a minimum.

As shown in FIGS. 6 and 7, inasmuch as the centers of the chips 91u-91w, 92u-92w, which act as heating bodies at least with respect to the flow direction of the cooling fluid, correspond to the chambers 122, the chambers 122 where turbulent flows are generated can be positioned directly below the heating bodies. Consequently, heat generated by the chips 91u-91w, 92u-92w can be radiated more efficiently, for more greatly increasing the cooling capability of the cooling apparatus 10. Intervals between the chambers 122 along the flow direction of the cooling fluid need not necessarily be equal to each other as shown in FIG. 6, but may be changed appropriately depending on the intervals between the chips 91u-91w, 92u-92w which act as heating bodies.

The statement, "centers of the heating bodies at least with respect to the flow direction of the cooling fluid correspond to the chambers 122" implies that the central lines CL, passing through centers of the chips 91u-91w, 92u-92w that act as heating bodies, may be positioned within the chambers 122. Naturally, each of the positions of the central lines CL may be at the position of a central line CL1 or CL2, as shown in FIG. 7. Further, the statement, "centers of the heating bodies at least with respect to the flow direction of the cooling fluid correspond to the chambers 122" may also imply that the centers of the devices, which produce the most heat among the chips 91u-91w, 92u-92w that act as heating bodies, may be positioned within the chambers 122. For example, the centers of the arm devices 81u-81w, 82u-82w or the diodes 83u-83w, 84u-84w which produce the greatest amount of heat, or which need to be cooled most, may reside in positions corresponding to the chambers 122.

In the cooling apparatus 10, ends of the cooling fins 120 corresponding to the recesses 118 have round portions 121 thereon. The round portions 121 allow the cooling fluid to flow smoothly from the chambers 122 into the passageways between the cooling fins 120, without causing a large pressure loss, unlike the edged structure according to the background art. Therefore, the cooling fluid can flow smoothly through the cooling fluid passage 102, thereby increasing the cooling capability. Furthermore, since the load on the circulation pump 110 is reduced, the circulation pump 110 can be reduced in size, and hence the cooling apparatus 10 can be reduced in size and weight. Also, the degree of freedom at which the cooling apparatus 10 can be installed is increased.

As shown in FIG. 6, the heat radiating plate 94, serving as a heat spreader, is disposed on the surface of the switching module 98, which is held against the casing 100. The chips 91*u*-91*w*, 92*u*-92*w*, serving as heating bodies, are disposed on the common heat radiating plate 94. Thus, the chambers 122 are disposed directly below the chips 91*u*-91*w*, 92*u*-92*w*, which produce the greatest amount of heat, and the heat from the chips 91*u*-91*w*, 92*u*-92*w*, which is diffused into the heat radiating plate 94, is efficiently radiated through the heat radiating plate 94 toward the cooling fins 120. In other words, heat from the chips 91*u*-91*w*, 92*u*-92*w* can be exchanged with the cooling fluid over a wider area, thus allowing the cooling apparatus 10 to have an increased cooling capability.

In the DC/DC converter 36, which is cooled by the cooling apparatus 10, the upper chips 91*u*-91*w* and the lower chips 92*u*-92*w* of the switching module 98 may produce different amounts of heat. Normally, the upper chips 91*u*-91*w*, which are used in the regenerative mode, generate a greater amount of heat than the lower chips 92*u*-92*w*, which are used in the propulsive power mode.

The fuel cell vehicle 20 has characteristics such that, when it produces a high level of output power, the voltage across the terminals of the fuel cell 22 tends to be lowered. Even if the vehicle produces the same level of output power when it is operated in the regenerative and propulsive power modes, the voltage difference between the primary end 1S and the secondary end 2S of the arm devices 81*u*-81*w*, 82*u*-82*w*, which serve as switching devices, is greater when the vehicle is in the regenerative mode, which is affected by a counter electromotive force of the motor, than when the vehicle is in the propulsive power mode, thus resulting in a large switching loss. Therefore, if the devices in the regenerative mode (the upper chips 91*u*-91*w*) and the devices in the propulsive drive mode (the lower chips 92*u*-92*w*) are identically designed for cooling, the devices in the regenerative mode are subject to stricter thermal conditions, and are unable to produce the same regenerated amount of energy as the devices in the propulsive drive mode.

In the method of cooling the vehicular DC/DC converter according to the present embodiment, the upper chips 91*u*-91*w* are disposed on the first straight portion 114, which is positioned upstream of the bend 104, and the lower chips 92*u*-92*w* are disposed on the second straight portion 116, which is positioned downstream of the bend 104 in the cooling apparatus 10. In other words, the cooling fluid passage 102 supplies cooling fluid to the upper arm devices 81*u*-81*w* used in the regenerative mode, which produce a large amount of heat (thermal load), and thereafter supplies the cooling fluid in sequence to the lower arm devices 82*u*-82*w* used in the propulsive drive mode via the bend 104. Therefore, the devices in the regenerative mode, which produce a large amount of heat, are initially cooled, and the upper arm devices 81*u*-81*w* are thus prevented from becoming overheated, thereby maximizing the maximum output power as well as the time in which the maximum output power can be generated.

Consequently, the cooling capability of the DC/DC converter 36 in the regenerative mode can effectively be increased, in order to increase the amount of electric power that can be regenerated by the fuel cell vehicle 20.

Since the cooling fluid passage 102 has a U-shaped structure extending from the first straight portion 114 via the bend 104 to the second straight portion 116, the inlet port 106 and the outlet port 108 can be placed together on one side surface of the cooling apparatus 10. Accordingly, the cooling apparatus 10 can be reduced in size, and the piping that extends to the circulation pump 110 and the radiator 112 can be facilitated and simplified in structure. The cooling fluid passage 102 may have a passage structure which is straight, curved, etc., in view of the installation space available on the vehicle, rather than the U-shaped structure including the bend 104.

Figure 9:
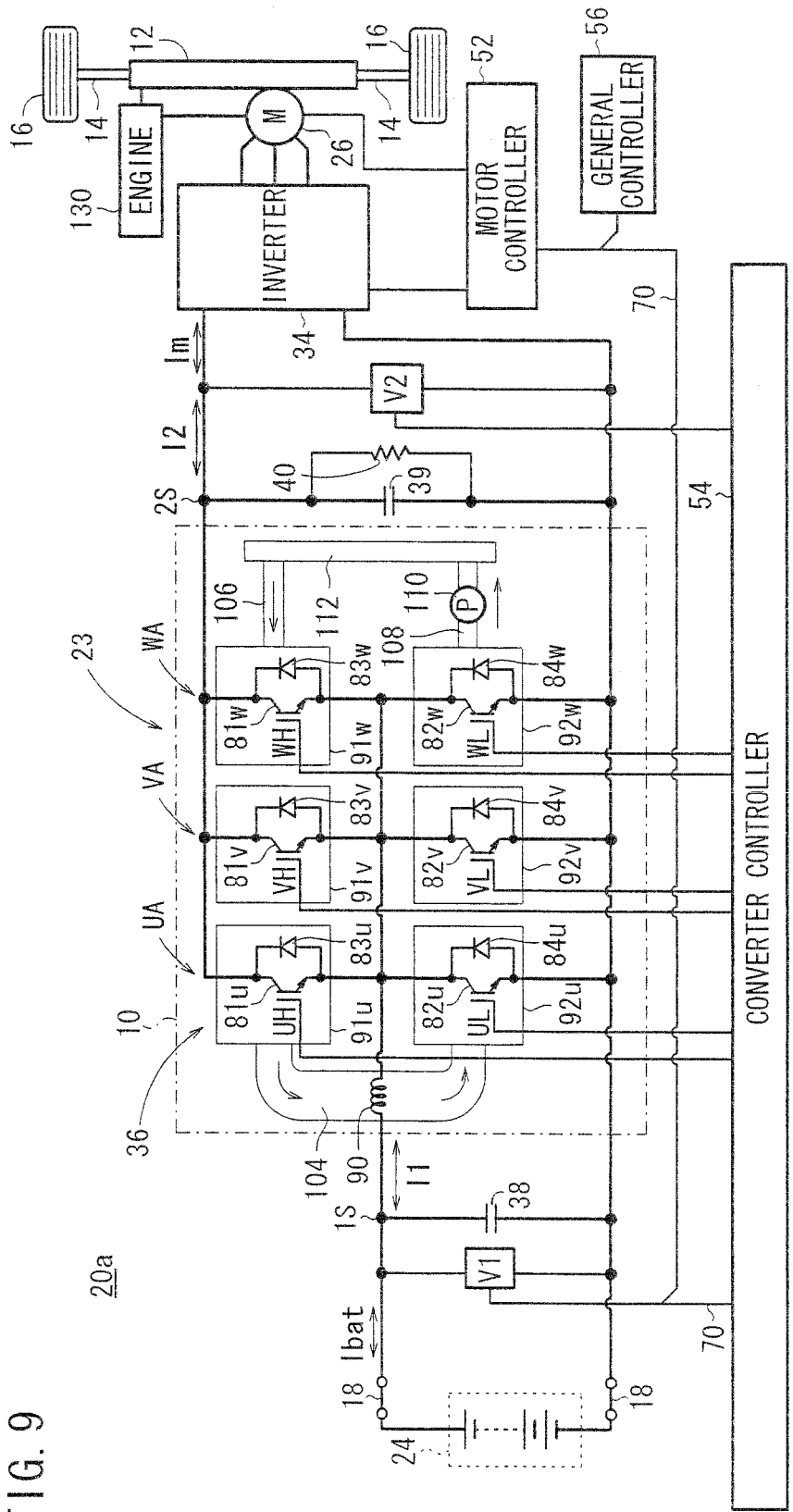
FIG. 9 is a circuit diagram of an electric vehicle according to a modified example of the present invention.

As shown in FIG. 9, the fuel cell vehicle 20, as an electric vehicle according to the present embodiment, may be constructed as an electric vehicle 20*a* which is free of the fuel cell 22 and components related thereto, and which includes an engine (internal combustion engine) 130 having an output shaft coupled to the motor 26 and a speed reducer 12. Such an electric vehicle 20*a* is constructed as a parallel hybrid vehicle.

Figure 10:
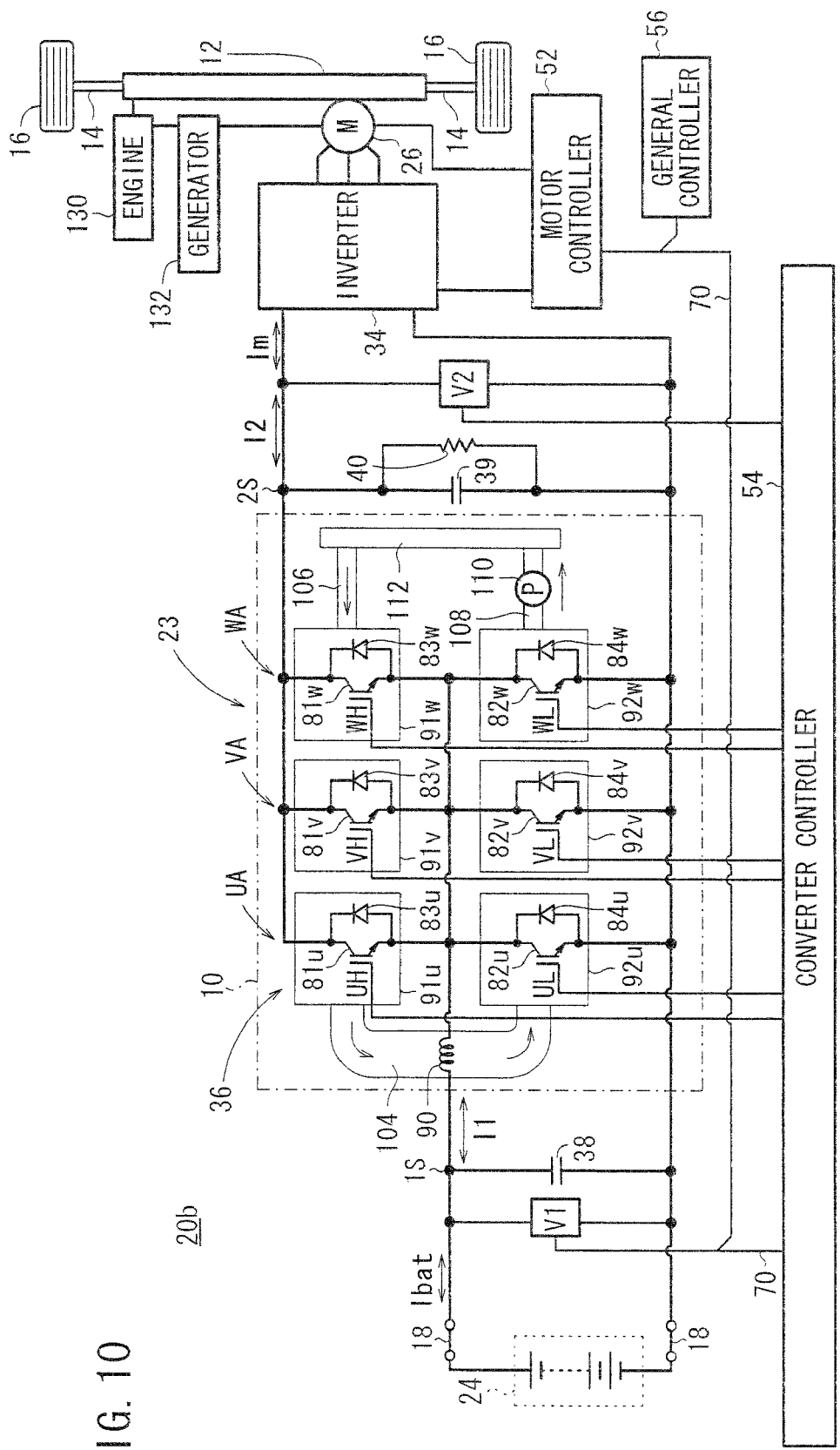
FIG. 10 is a circuit diagram of an electric vehicle according to another modified example of the present invention.

Furthermore, as shown in FIG. 10, the fuel cell vehicle 20 may be constructed as an electric vehicle 20*b*, which is free of the fuel cell 22 and components related thereto, and which includes an engine 130 and a generator 132, the engine 130 having an output shaft coupled to the generator 132 and a speed reducer 12, with the generator 132 being electrically connected to the motor 26. The electric vehicle 20*b* is constructed as a series/parallel hybrid vehicle. If the output shaft of the engine 130 is coupled only to the generator 132 and is not coupled to the speed reducer 12, or if the speed reducer 12 itself is dispensed with, then the electric vehicle 20*b* may be constructed as a series hybrid vehicle.

The fuel cell vehicle 20, as an electric vehicle according to the present embodiment, may be constructed as an electric vehicle, which is free of the fuel cell 22 and added components related thereto within the engine 130, etc.

The present invention is not limited to the above embodiments, but various other arrangements may be employed therein without departing from the scope of the invention.

The invention claimed is:

1. An electric vehicle comprising:
an electric motor for rotating wheels;
an electric generating device and an electricity storage device for supplying electric power in a parallel fashion to the electric motor;
a DC/DC converter connected between the electricity storage device and the electric generating device, for converting a voltage generated by the electricity storage device and applying the converted voltage to the electric motor, and converting a regenerated voltage produced by the electric motor in a regenerative mode or a voltage generated by the electric generating device and applying the converted voltage to the electricity storage device; and
a cooling apparatus for cooling the DC/DC converter, the cooling apparatus having a cooling fluid passage therein through which a cooling fluid flows, the cooling fluid passage including a bend;
wherein the DC/DC converter has phase arm devices including at least one set of upper arm devices and lower arm devices disposed between the electricity storage device and the electric motor; and wherein the cooling apparatus is constructed such that the cooling fluid flowing through a first straight portion upstream of the bend cools the upper arm devices arranged along the first straight portion before the bend and the cooling fluid flowing through a second straight portion downstream of the bend cools the lower arm devices arranged along the second straight portion after the bend.

2. An electric vehicle according to claim 1, wherein the DC/DC converter has a reactor for discharging and storing energy when converting the voltage between the electricity storage device and the electric motor; and wherein the cooling apparatus is constructed such that the cooling fluid flowing in the bend cools the reactor.

3. An electric vehicle according to claim 1, wherein the electric generating device comprises a fuel cell.

4. An electric vehicle comprising:

an electric motor for rotating wheels;

an electricity storage device for supplying electric power to the electric motor;

a DC/DC converter connected between the electricity storage device and the electric motor, for converting a voltage generated by the electricity storage device and applying the converted voltage to the electric motor, and converting a regenerated voltage produced by the electric motor in a regenerative mode and applying the converted voltage to the electricity storage device; and a cooling apparatus for cooling the DC/DC converter, the cooling apparatus having a cooling fluid passage therein through which a cooling fluid flows, the cooling fluid passage including a bend;

wherein the DC/DC converter has phase arm devices including at least one set of upper arm devices and lower arm devices disposed between the electricity storage device and the electric motor; and wherein the cooling apparatus is constructed such that the cooling fluid flowing through a first straight portion upstream of the bend cools the upper arm devices arranged along the first straight portion before the bend and the cooling fluid flowing through a second straight portion downstream of the bend cools the lower arm devices arranged along the second straight portion after the bend.

5. A method of cooling a vehicular DC/DC converter, comprising the steps of:

providing a bend in a cooling fluid passage through which a cooling fluid flows to cool a DC/DC converter, which is connected between an electric motor for rotating wheels and an electricity storage device for supplying electric power to the electric motor, and which has phase arm devices including at least one set of upper arm devices and lower arm devices;

cooling the upper arm devices arranged along a first straight portion before the bend with the cooling fluid flowing through the first straight portion upstream of the bend; and cooling the lower arm devices arranged along a second straight portion after the bend with the cooling fluid flowing through the second straight portion downstream of the bend.

6. The electric vehicle of claim 1, wherein the upper arm devices and the lower arm devices are aligned in a switching module of the DC/DC converter.

7. The electric vehicle of claim 1, wherein the cooling fluid flowing upstream of the bend flows through a first straight portion, and the cooling fluid flowing downstream of the bend flows through a second straight portion.

* * * * *